(12) United States Patent
Choi et al.

(10) Patent No.: US 8,816,499 B2
(45) Date of Patent: Aug. 26, 2014

(54) ELECTRICAL INTERCONNECTIONS OF SEMICONDUCTOR DEVICES AND METHODS FOR FABRICATING THE SAME

(71) Applicant: Samsung Electronics Co., Ltd., Suwon-si (KR)

(72) Inventors: Ju-il Choi, Suwon-si (KR); Jeong-Woo Park, Suwon-si (KR); Jeonggi Jin, Osan-si (KR); Yeun-Sang Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/826,694

(22) Filed: Mar. 14, 2013

(65) Prior Publication Data
US 2013/0313707 A1 Nov. 28, 2013

(30) Foreign Application Priority Data
May 24, 2012 (KR) ........................ 10-2012-0055443

(51) Int. Cl.
*H01L 23/488* (2006.01)
*H01L 23/00* (2006.01)
*H01L 23/31* (2006.01)

(52) U.S. Cl.
CPC ............ *H01L 24/12* (2013.01); *H01L 23/3128* (2013.01)
USPC ...................................................... 257/738

(58) Field of Classification Search
CPC ......... H01L 24/10; H01L 24/11; H01L 24/12; H01L 24/13; H01L 23/3128
USPC ................................................ 257/738, 779
See application file for complete search history.

(56) References Cited

U.S. PATENT DOCUMENTS

| | | | |
|---|---|---|---|
| 6,577,001 B2 | 6/2003 | Kobayashi | |
| 6,930,032 B2 | 8/2005 | Sarihan et al. | |
| 6,940,160 B1* | 9/2005 | Hanaoka et al. | 257/692 |
| 6,959,856 B2* | 11/2005 | Oh et al. | 228/245 |
| 7,221,054 B2* | 5/2007 | Minda | 257/738 |
| 7,271,483 B2 | 9/2007 | Lin et al. | |
| 7,300,864 B2* | 11/2007 | Ma et al. | 438/612 |
| 7,375,032 B2* | 5/2008 | Seliger et al. | 438/695 |
| 7,459,785 B2 | 12/2008 | Daubenspeck et al. | |
| 7,674,362 B2 | 3/2010 | Hu | |
| 7,713,860 B2 | 5/2010 | Yu | |
| 7,766,671 B2 | 8/2010 | Hattori | |
| 8,230,563 B2 | 7/2012 | Tsuda | |
| 2005/0082685 A1* | 4/2005 | Bojkov et al. | 257/780 |
| 2006/0105534 A1* | 5/2006 | Edelstein et al. | 438/329 |
| 2008/0012128 A1* | 1/2008 | Makino et al. | 257/737 |

(Continued)

FOREIGN PATENT DOCUMENTS

| | | |
|---|---|---|
| JP | 05-013496 | 1/1993 |
| JP | 05-074780 | 3/1993 |

(Continued)

*Primary Examiner* — Nathan Ha
(74) *Attorney, Agent, or Firm* — Myers Bigel Sibley & Sajovec, PA

(57) ABSTRACT

Provided are electrical interconnections and methods for fabricating the same. The electrical interconnection may include a substrate including a bonding pad, a solder ball electrically connected to the bonding pad, a solder supporter on the bonding pad, a portion of the solder ball filling the solder supporter, and a metal layer between the bonding pad and the solder supporter, the metal layer having an ionization tendency lower than the bonding pad.

12 Claims, 26 Drawing Sheets

(56) References Cited

U.S. PATENT DOCUMENTS

| | | |
|---|---|---|
| 2008/0083983 A1 | 4/2008 | Jang et al. |
| 2009/0015285 A1* | 1/2009 | Farooq et al. ............ 324/763 |
| 2009/0098723 A1* | 4/2009 | Yu ............................ 438/614 |
| 2011/0024900 A1* | 2/2011 | Walter et al. ............. 257/737 |
| 2011/0186991 A1 | 8/2011 | Lee et al. |
| 2011/0210443 A1* | 9/2011 | Hart et al. ................ 257/738 |

FOREIGN PATENT DOCUMENTS

| | | |
|---|---|---|
| JP | 05-226419 | 9/1993 |
| JP | 11-126793 | 5/1999 |
| JP | 11-233561 | 8/1999 |
| JP | 2010-103161 | 5/2010 |
| KR | 1020060067757 A | 6/2006 |
| KR | 1020110064470 A | 6/2011 |

* cited by examiner

ELECTRICAL INTERCONNECTIONS OF SEMICONDUCTOR DEVICES AND METHODS FOR FABRICATING THE SAME

CROSS-REFERENCE TO RELATED APPLICATION

This U.S. nonprovisional patent application claims priority under 35 U.S.C. §119 of Korean Patent Application 10-2012-0055443 filed on May 24, 2012, the entire contents of which are hereby incorporated by reference.

FIELD

The present inventive concept relates to electrical interconnections of semiconductor devices and methods for fabricating the same.

BACKGROUND

Generally, a semiconductor device has an electrical interconnection which electrically connects into a different semiconductor device or printed circuit board. To electrically connect the semiconductor device to electrical apparatus more reliably and stably, there may be needed an improved electrical interconnection for the semiconductor device.

SUMMARY

Embodiments of the inventive concepts provide an electrical interconnection of the semiconductor device having a solder supporter in which solder fills in a relatively large volume.

Other embodiments of the inventive concepts provide an electrical interconnection of the semiconductor, in which reliability of the electric connection is secured due to a large solder ball, and a method for fabricating the same.

In still other embodiment of the inventive concepts, an electrical interconnection of the semiconductor device and a method for fabricating the same may be configured to decrease effects of intermetallic compounds and/or cracks even if the intermetallic compounds and/or cracks occur at a boundary between the solder supporter and the solder.

According to exemplary embodiments of the present inventive concepts, an electrical interconnection may comprise: a substrate comprising a bonding pad formed thereon; a solder ball electrically connected to the bonding pad; a solder supporter on the bonding pad, a portion of the solder ball filling the solder supporter; and a metal layer between the bonding pad and the solder supporter, the metal layer having an ionization tendency lower than the bonding pad.

In exemplary embodiments, the electrical interconnection may further comprise a passivation layer on the substrate through which the bonding pad is exposed.

In exemplary embodiments, the solder supporter may comprise: a floor adjacent to the bonding pad; and a vertical wall upright from an edge of the floor, wherein the floor and the vertical wall define an inner space of the solder supporter, the inner space being filled with a portion of the solder ball, and wherein the other portion of the solder ball protrudes outside of the solder supporter.

In exemplary embodiments, at least one of the floor and the vertical wall has a shape of stairs.

In exemplary embodiments, the solder supporter may further comprise an extension extending outwardly from the vertical wall.

In exemplary embodiments, a contacting portion of the solder supporter between the floor and the vertical wall may be rounded.

In exemplary embodiments, the electrical interconnection may further comprise a bump pillar between the bonding pad and the metal layer, wherein the metal layer has an ionization tendency lower than the bump pillar.

According to exemplary embodiments of the present inventive concepts, a method for fabricating an electrical interconnection may comprise: forming a bonding pad on the substrate; forming a metal layer electrically connected to the bonding pad and having an ionization tendency lower than the bonding pad; forming a solder supporter having an inner space therein on the bonding pad by electroplating using the metal layer; forming a solder layer on the solder supporter; and reflowing the solder to form a solder ball, a part of the solder ball filling the inner space of the solder supporter and the other part of the solder ball protruding outside of the solder supporter.

In exemplary embodiments, forming the metal layer may comprise: forming a mask on the substrate, the mask having an opening pattern which exposes the bonding pad; and forming the metal layer in the opening pattern, the metal layer being electrically connected to the bonding pad.

In exemplary embodiments, forming the solder supporter may comprise: forming a floor on the metal layer; and forming a vertical wall extending along inner surface of the opening pattern from an edge of the floor, wherein the vertical wall and the floor define the inner space of the solder supporter.

In exemplary embodiments, forming the mask may comprise: forming a first mask having a first opening, which exposes the bonding pad; and forming a second mask having a second opening wider than the first opening.

In exemplary embodiments, forming the solder supporter may comprise: forming a floor on the metal layer; and forming a vertical wall extending along inners surfaces of the first and second opening patterns from an edge of the floor such that the vertical wall has a stair-stepped shape.

In exemplary embodiments, the method may further comprise forming a bump pillar electrically connected to the bonding pad.

In exemplary embodiments, forming the metal layer comprises electroplating metal having an ionization tendency smaller than the bump pillar.

In exemplary embodiments, forming the metal layer may comprise: forming an electroless plating layer on the substrate; forming a mask having an opening pattern on the electroless plating layer, the mask not overlapping with the bonding layer; removing the mask after forming the solder supporter in the opening pattern; and selectively removing a part of the electroless plating layer which is exposed through removing the mask.

BRIEF DESCRIPTION OF THE DRAWINGS

The foregoing and other features and advantages of example embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF EMBODIMENTS

Figure 1A:
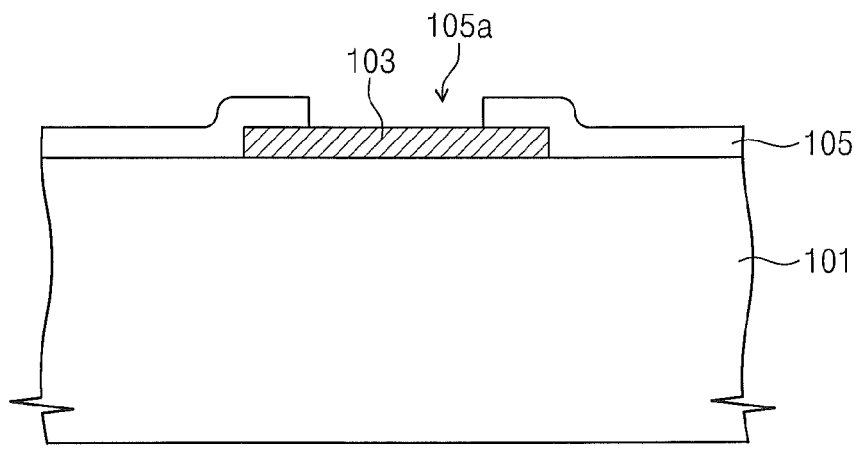
FIGS. 1A to 1E are cross-sectional views illustrating a method for fabricating an electrical interconnection according to exemplary embodiments of the present inventive concepts.

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and, thus, their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of example embodiments of inventive concepts. Aspects of example embodiments of inventive concepts explained and illustrated herein include their complementary counterparts. The same reference numerals or the same reference designators denote the same elements throughout the specification.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

<Embodiment 1>

FIGS. 1A to 1E are cross-sectional views illustrating a method for fabricating an electrical interconnection according to exemplary embodiments of the present inventive concepts. FIG. 1F is a cross-sectional view illustrating an electrical interconnection fabricated by a method different from a method according to exemplary embodiments of the present inventive concepts. FIGS. 2A to 2D are perspective views illustrating electrical connections fabricated by methods according to exemplary embodiments of the present inventive concepts.

Referring to FIG. 1A, a bonding pad 103 may be formed on a substrate 101 and a passivation layer 105 may be formed on the substrate 101. The passivation layer 105 may have an opening 105a through which the bonding pad 103 is exposed. The substrate 101 may be a chip level or a wafer level semiconductor substrate, for example a silicon substrate. The bonding pad 103 may be formed by depositing a conductor, such as aluminum or copper on the substrate 101 and patterning the conductor. Alternatively, the bonding pad 103 may be formed within the substrate 101. The passivation layer 105 may be formed by depositing an insulator on the substrate 101 and patterning the insulator. The passivation layer 105 may have a single-layered or a multiple-layered structure.

Figure 1B:
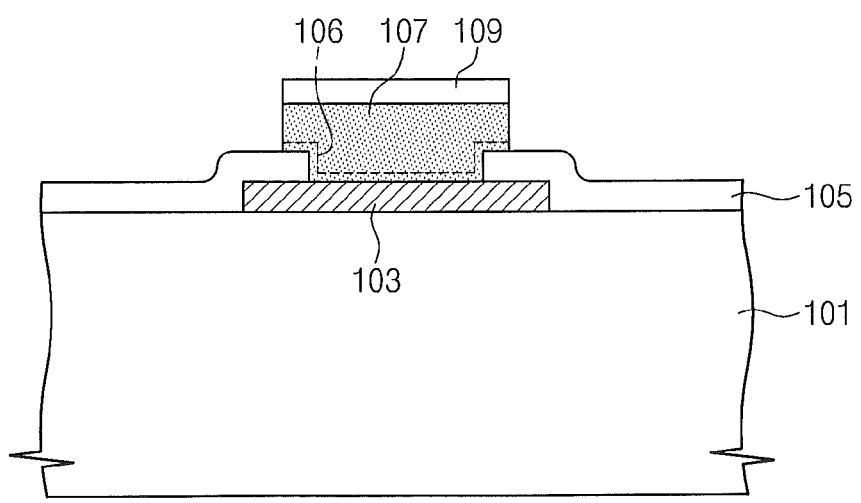

Referring to FIG. 1B, a bump pillar 107 may be formed to be connected to the bonding pad 103. For example, the bump pillar 107 may be formed by depositing or plating a metal layer such as copper and patterning the metal layer. The bump pillar 107 may be limited on the bonding pad 103 or extended onto the passivation layer 105. An under bump metallization 106 may be further provided between the bonding pad 103 and the bump pillar 107. A metal cap 109 may be formed to cover a top surface of the bump pillar 107. The metal cap 109 may comprise a metal having an ionization tendency or reactivity lower than the bump pillar 107 and/or the bonding pad 103. As an example, the metal cap 109 may comprise a noble metal such as Ru, Rh, Pd, Ag, Re, Os, Ir, Pt, Au or any combinations thereof. According to the present inventive concept, the metal cap 109 may be formed by electroplating Au.

Figure 1C:
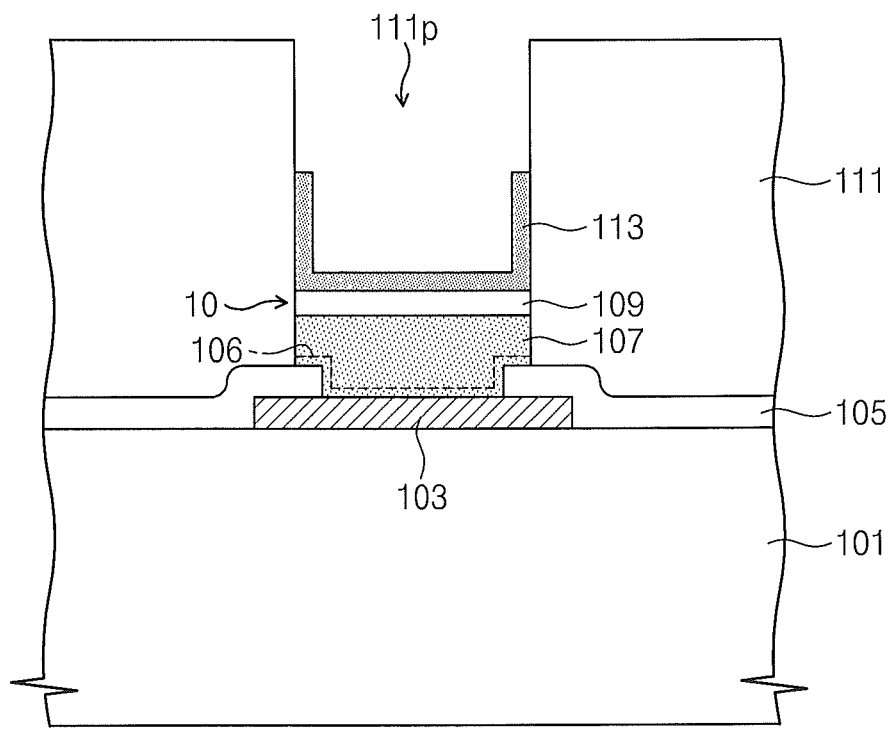

Referring to FIG. 1C, a mask 111 may be formed on the substrate 101. The mask 111 may have an opening pattern 111p, which exposes the metal cap 109. The mask 111 may be formed by patterning a photoresist layer coated on the substrate 101. A conductive solder supporter 113 may be formed in the opening pattern 111p by an electroplating using the mask 111. Because the metal cap 109 may comprise the noble metal as described above, the metal cap 109 may hardly react with an electroplating solution or an additive added to the electroplating solution. The additive may comprise an accelerator, such as MPS (1-propanesulfonic acid, 3-mercapto-monosodium salt) or SPS (bis(3-sulfopropyl)disulfide disodium salt), and a suppressor such as PEG (polyethylene glycol). Moreover, an electric field may be concentrated at a point where the metal cap 109 meets the mask 111, i.e. a bottom corner 10 of the opening pattern 111p. Therefore, an electroplating process on the metal cap 109 may occur at the corner 10. This may mean that the electroplating process for the solder supporter 113 may occur from the corner 10. The solder supporter 113 may comprise metal, such as Cu, Cu—Cr, Ti—W or any combinations thereof. As illustrated in FIGS. 2A to 2D, the electroplating at the corner 10 may make the solder supporter 113 have an inner space 113c comprising a vertical wall 113b, which stands up on an edge of a floor 113a such that a solder ball 115 may fill the inner space 113c as described later. The vertical wall 113b may extend along a sidewall of the mask 111 from the floor 113a.

Figure 1D:
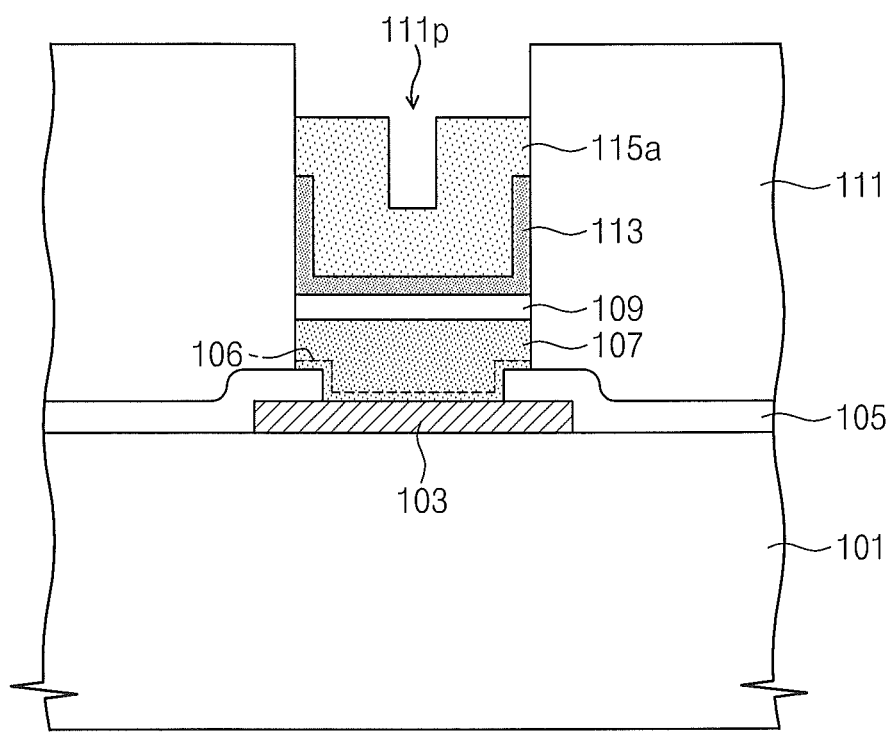

Referring to FIG. 1D, a solder 115a may fill the opening pattern 111p to cover the solder supporter 113. The solder 115a may comprise Pb, Sn, Ag, Cu, In, Zn, Bi, Sb or any combinations thereof. As one exemplary embodiment, the solder 115a may comprise lead-free solder such as Sn/Ag, Sn/Cu, Sn/Cu/Ag. The solder 115a may be formed by an electroplating process, a deposition process, or an evaporation process.

Figure 1E:
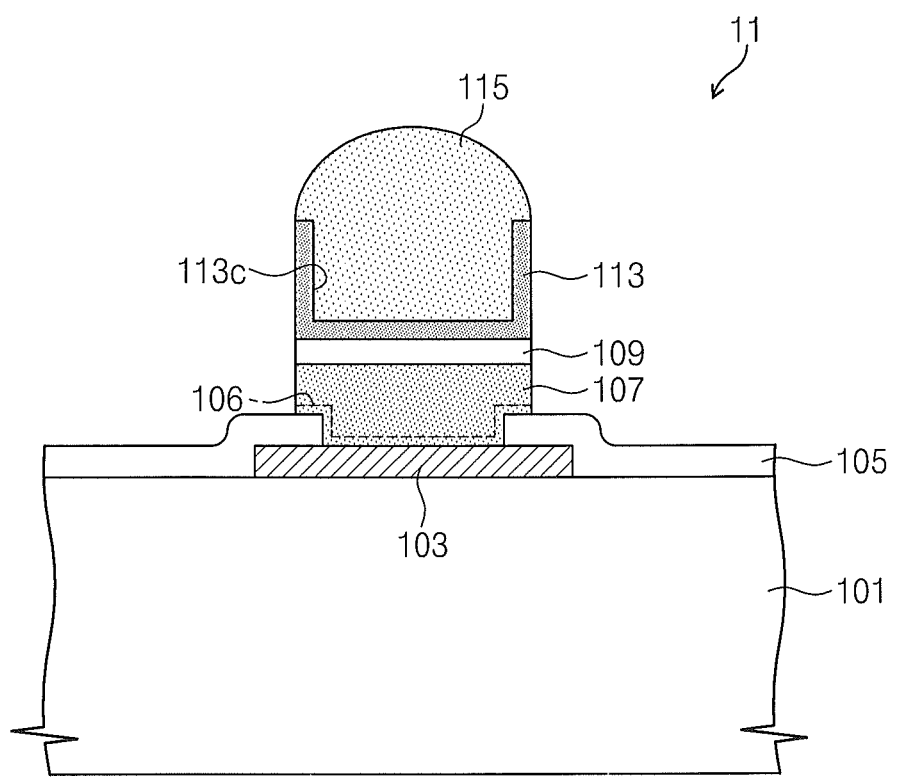
Figure 1F:
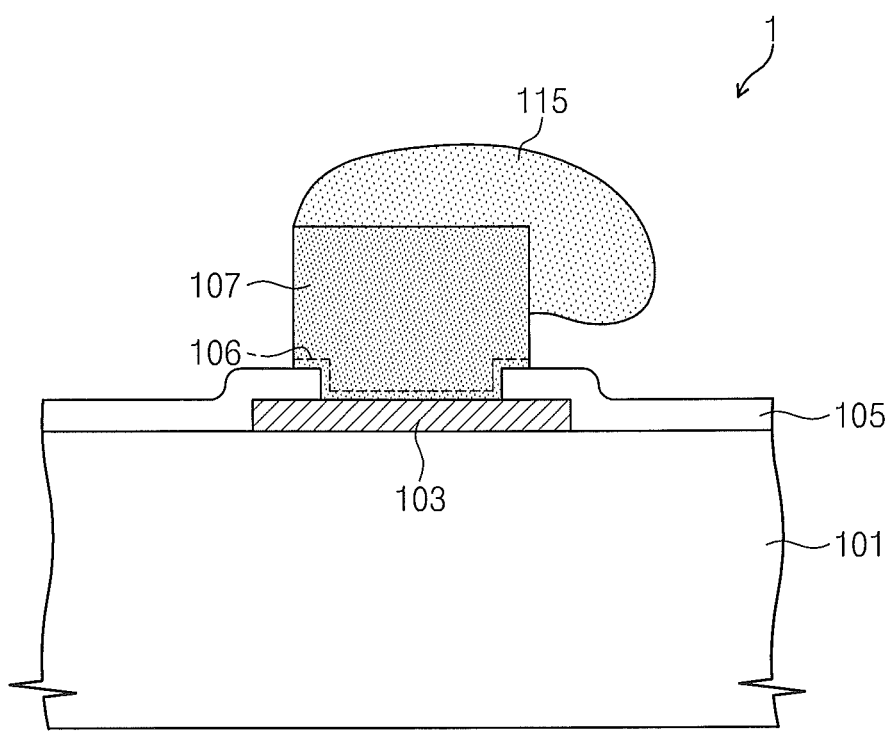
FIG. 1F is a cross-sectional view illustrating an electrical interconnection fabricated by a method different from a method according to exemplary embodiments of the present inventive concepts.
Figure 2A:
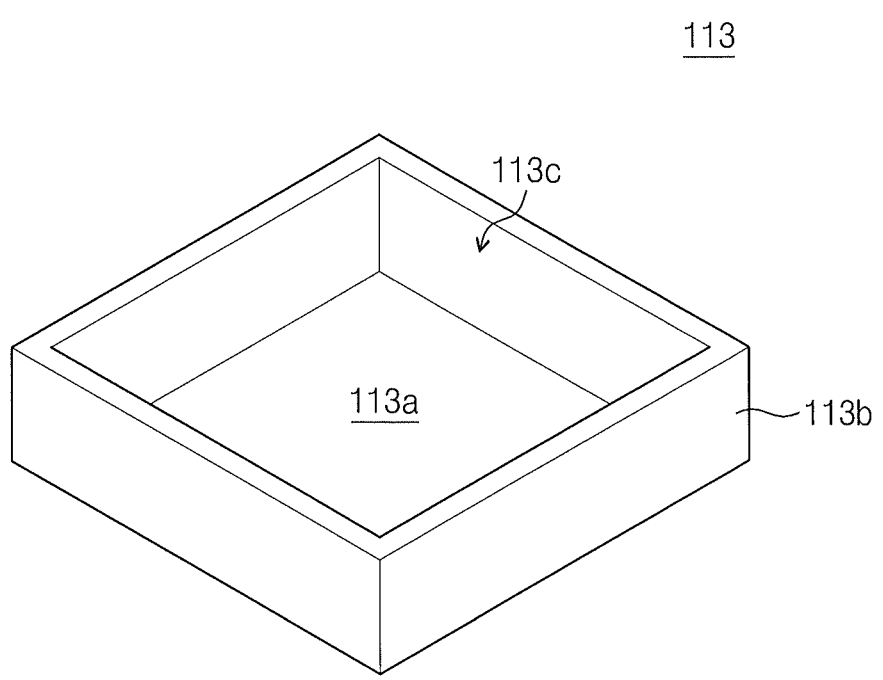
FIGS. 2A to 2D are perspective views illustrating electrical connections fabricated by methods according to exemplary embodiments of the present inventive concepts.
Figure 2B:
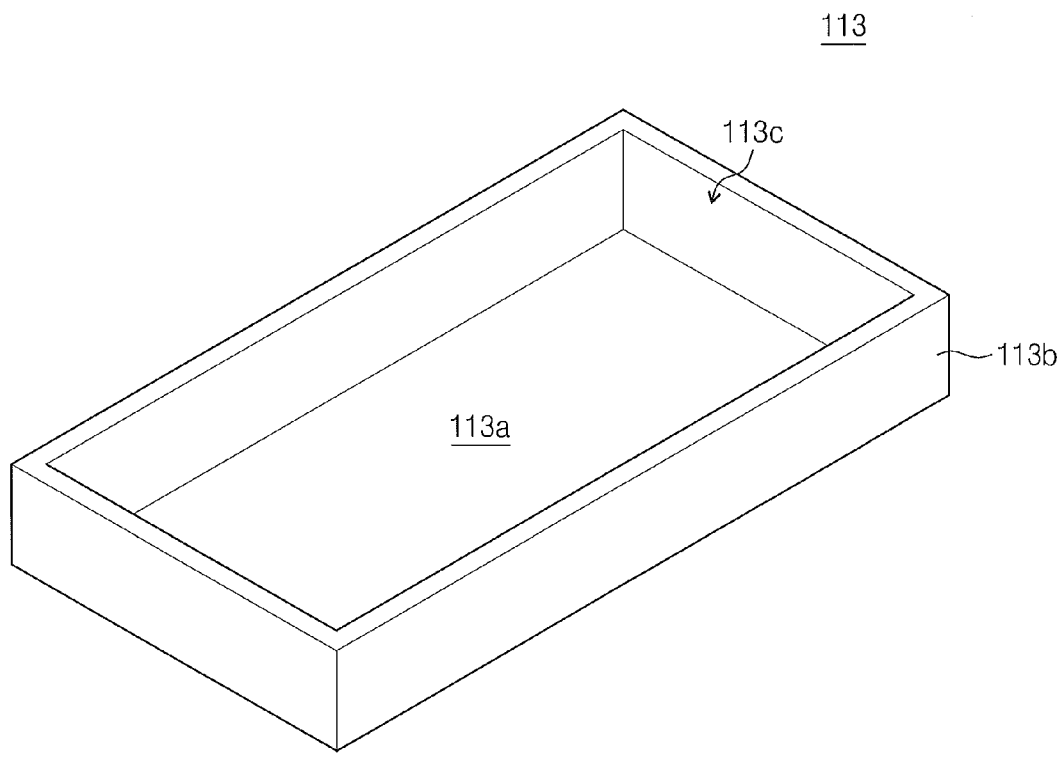
Figure 2C:
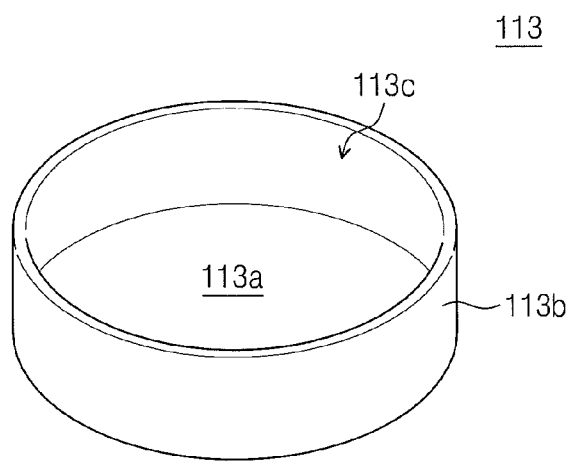
Figure 2D:
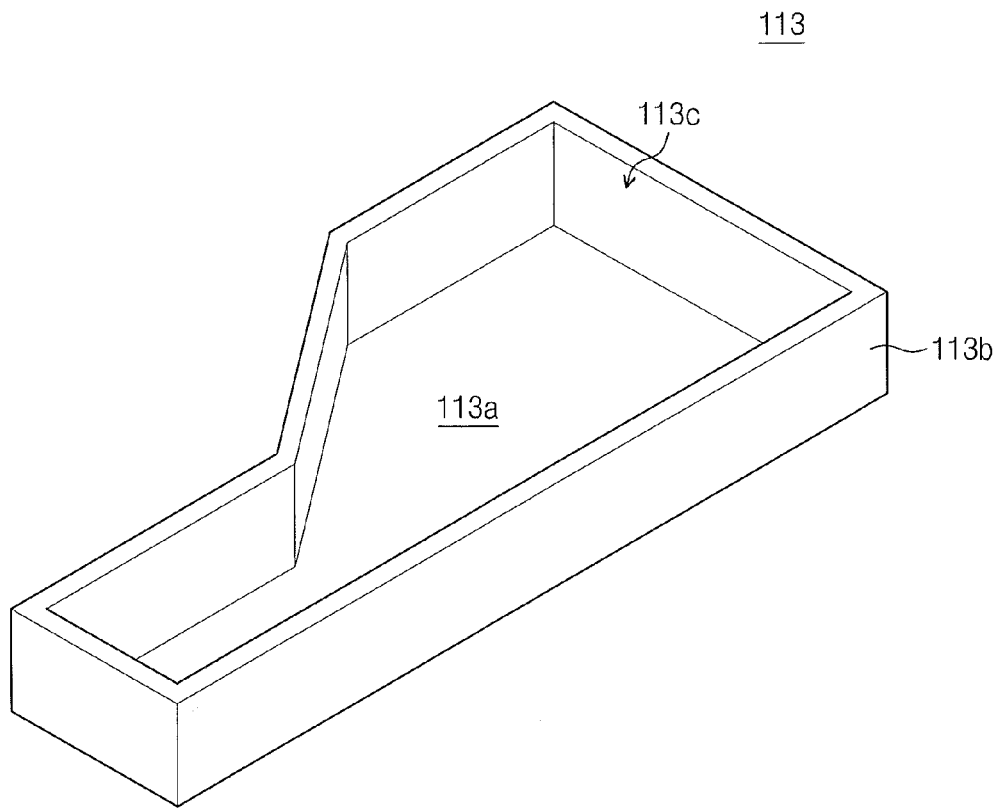

Referring to FIG. 1E, the mask 111 may be removed and then the solder 115a may be reflowed. A solder ball 115 may be formed to fill the inner space 113c of the solder supporter 113 due to the reflow of the solder 115a. The solder ball 115 may protrude over the solder supporter 113. Through sequence of the processes described above, a first electrical interconnection 11 may be formed to have the bracket-shaped solder supporter 113. The first electrical interconnection 11 may have a shape of pillar.

Referring to FIG. 1F, according to conventional method, the reflow process may make a solder 115a stream down from a top surface of a bump pillar 107, such that an electrical interconnection 1 may have a collapsed solder ball 115. The collapse phenomenon may be accelerated when the solder has a larger volume. According to the exemplary embodiment, the solder supporter 113 may provide the inner space 113c in which the solder ball 115 fills up. Though the volume of the solder 115a is larger, the solder supporter 113 may prevent the solder 115a from streaming down. Consequently, the solder ball 115 may have relatively large volume and perfect ball shape. Moreover, the solder supporter 113 may have the bracket or cup shape, such that an interface between the solder supporter 113 and the solder ball 115 depicted in FIG. 1E may be extended compared to an interface between the bump 107 and the solder ball 115 illustrated FIG. 1F. Therefore, when an intermetallic compound (IMC) and/or crack occur, the electrical interconnection 11 may have superior mechanical and/or electrical characteristics.

<Embodiment 2>

Figure 3A:
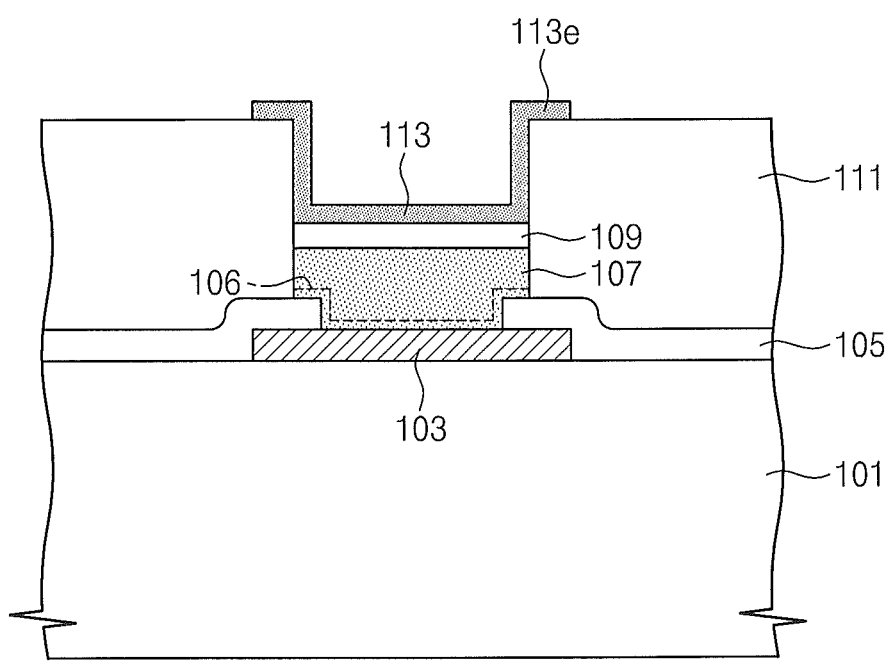
FIGS. 3A and 3B are cross-sectional views illustrating a method for fabricating an electrical interconnection according to exemplary embodiments of the present inventive concepts.
Figure 3B:
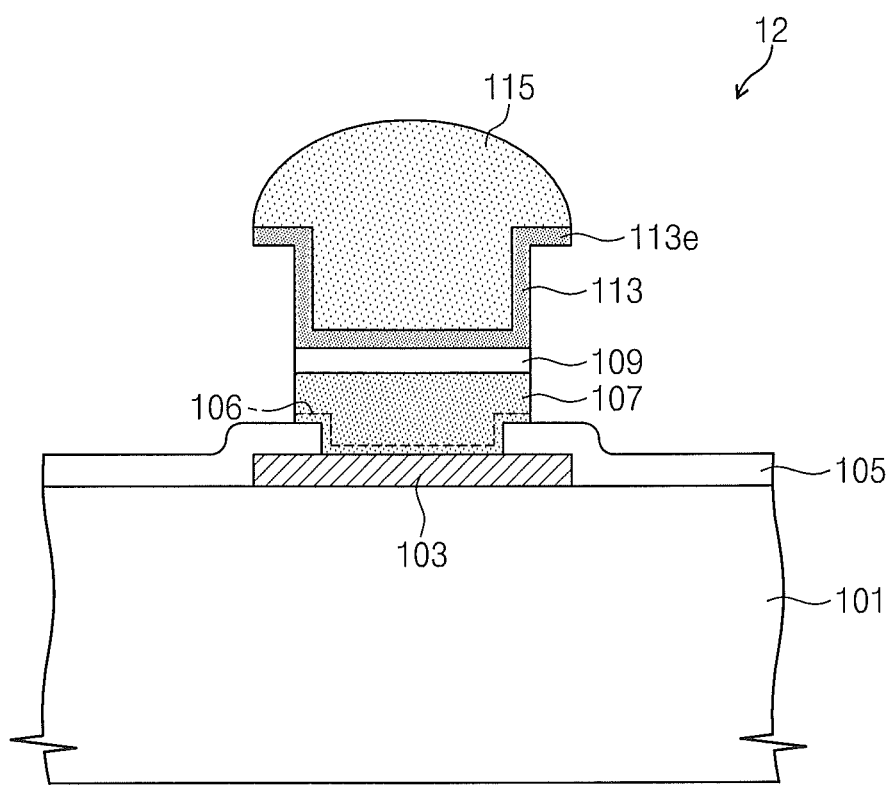

FIGS. 3A and 3B are cross-sectional views illustrating a method for fabricating an electrical interconnection according to exemplary embodiments of the present inventive concepts.

Referring to FIG. 3A, the solder supporter 113 may further comprise an extended portion 113e, which extends on a top surface the mask 111 when the solder supporter 113 is formed by the electroplating process using the metal cap 109 identical or analogous to the processes explained with reference to the FIGS. 1A to 1C.

Referring to FIG. 3B, the solder 115a may be further provided on the extended portion 113e, when the solder ball 115 is formed on the solder supporter 113, such that the solder ball 115 may be formed to have relatively larger volume. Therefore, a second electrical interconnection 12 may be formed to have the mushroom-shaped solder ball 115. The second electrical interconnection 12 may have a shape of a pillar.

<Embodiment 3>

Figure 4A:
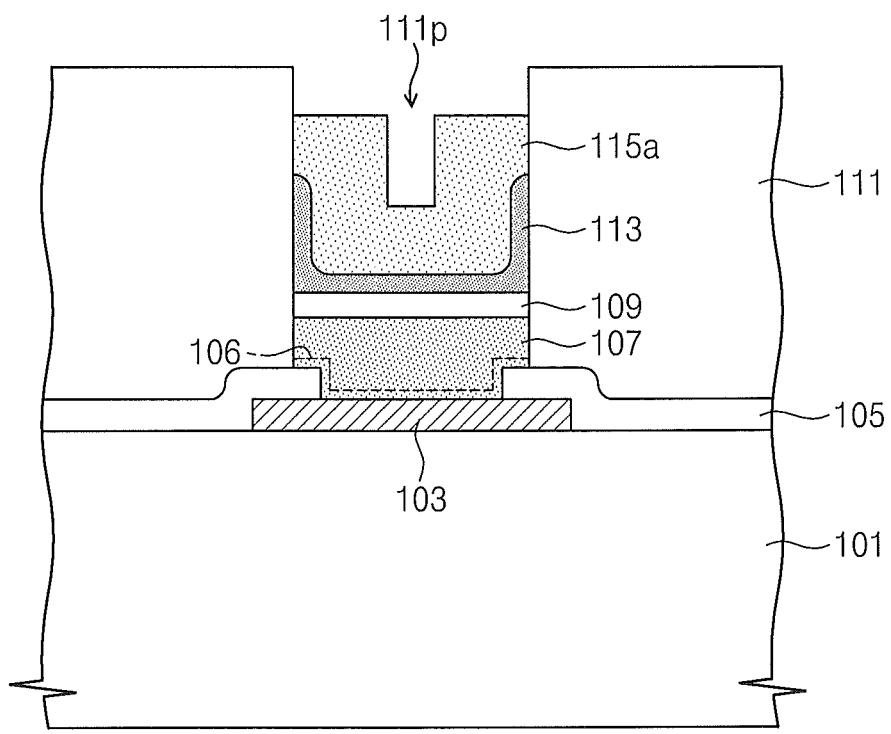
FIGS. 4A and 4B are cross-sectional views illustrating a method for fabricating an electrical interconnection according to exemplary embodiments of the present inventive concepts.
Figure 4B:
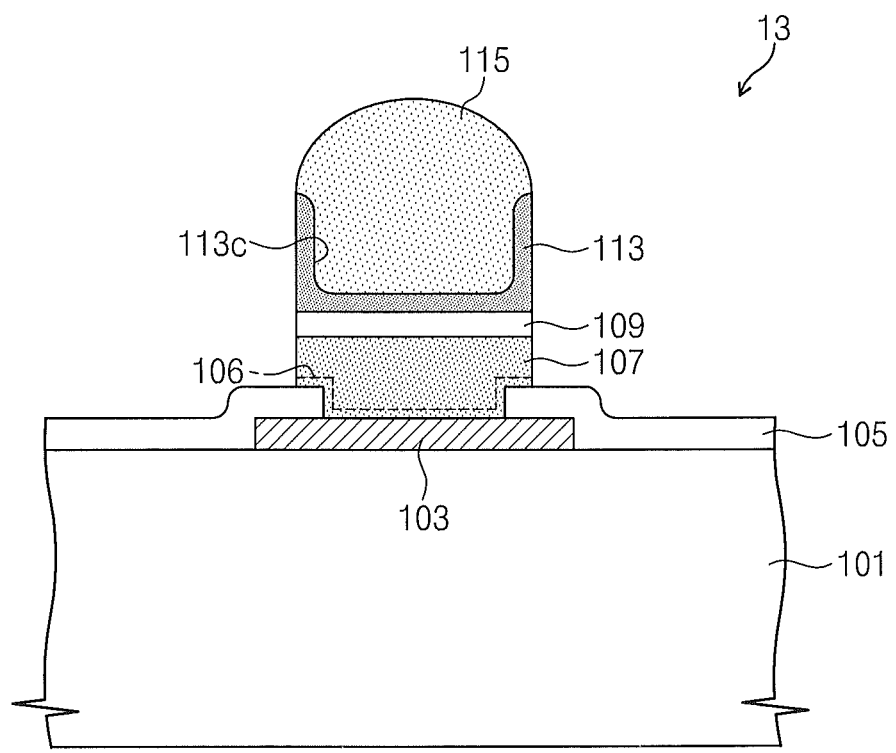

FIGS. 4A and 4B are cross-sectional views illustrating a method for fabricating an electrical interconnection according to exemplary embodiments of the present inventive concepts.

Referring to FIG. 4A, the solder ball 115 may be formed by the electroplating process using the metal cap 109 identical or analogous to the processes explained with reference to the FIGS. 1A to 1C and then the solder 115a may be formed to cover the solder supporter 113. The solder supporter 113 may have a rounded inner surface.

Referring to FIG. 4B, the solder ball 115 may be formed by the reflow of the solder 115a. Therefore, a third electrical interconnection 13 may be formed to have the solder ball 115 filling up the rounded inner space 113c. The third electrical interconnection 13 may have a shape of a pillar.

<Embodiment 4>

Figure 5A:
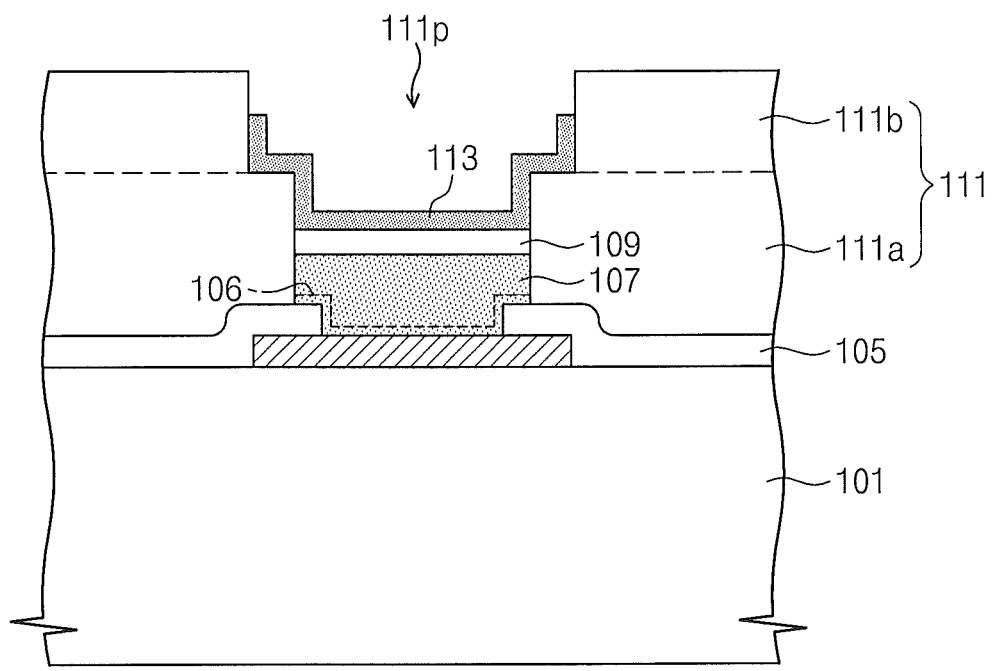
FIGS. 5A and 5B are cross-sectional views illustrating a method for fabricating an electrical interconnection according to exemplary embodiments of the present inventive concepts.
Figure 5B:
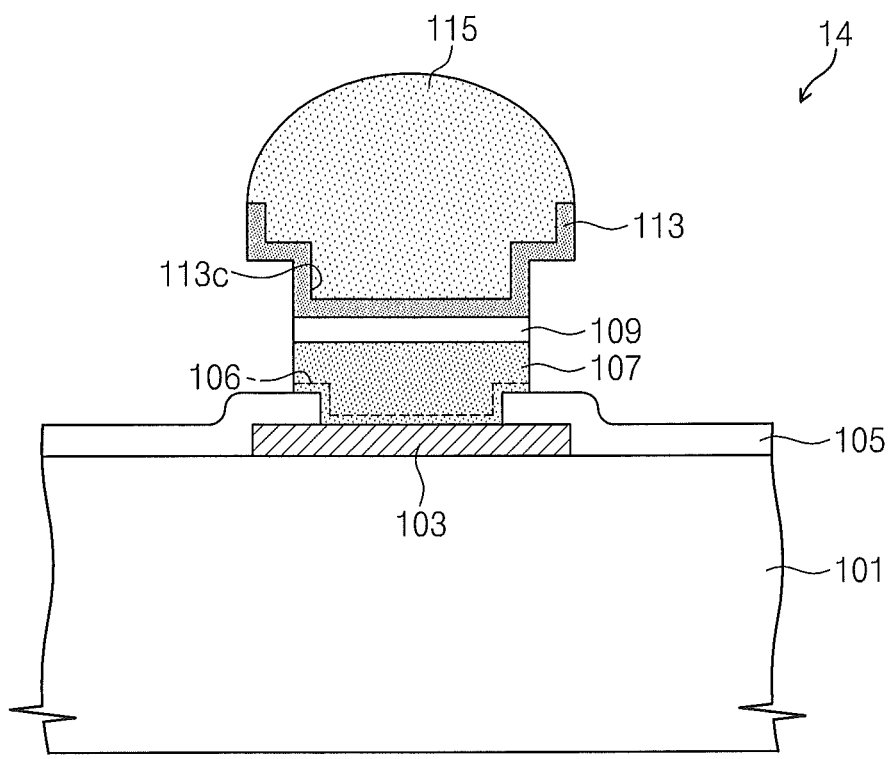

FIGS. 5A and 5B are cross-sectional views illustrating a method for fabricating an electrical interconnection according to exemplary embodiments of the present inventive concepts.

Referring to FIG. 5A, the solder supporter 113 may be formed after the formation of the mask 111 by processes identical or analogous to those explained with reference to the FIGS. 1A to 1C. The mask 111 may be formed to have a multi-layered structure. For example, the mask 111 may comprise a first mask 111a surrounding the bump pillar 107 and a second mask 111b recessed in a lateral direction. The first mask 111a may have a height greater than that of the bump pillar 107. The second mask 111b may not fully cover the first mask 111a, which may expose inner corners of the first mask 111a. In other words, an opening pattern of the second mask 111b may have a width greater than that of the first mask 111a. The opening pattern 111p of the mask 111 may be stair-stepped, such that the solder supporter 113 may have a stair-stepped shape.

Referring to FIG. 5B, the solder 115a may be provided and then reflowed to form the solder ball 115. Therefore, a fourth electrical interconnection 14 may be formed to have the solder ball 115, which fills up the rounded inner space 113c of the solder supporter 113. The fourth electrical interconnection 14 may have a shape of a pillar. The solder supporter 113 may have a stair-stepped structure, which extends laterally, such that the solder ball 115 may have an enlarged volume.

<Embodiment 5>

Figure 6A:
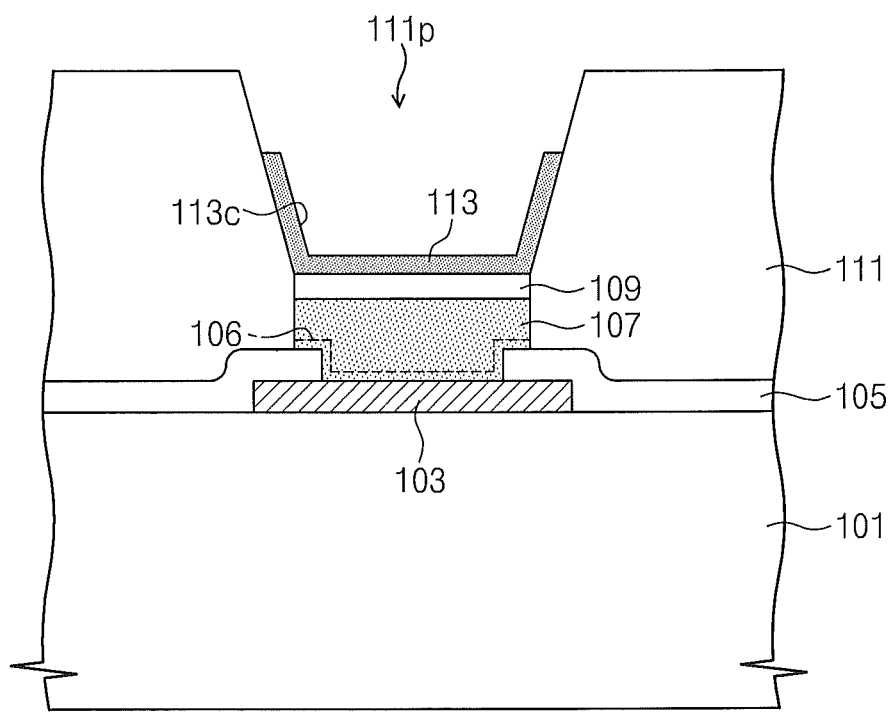
FIGS. 6A and 6B are cross-sectional views illustrating a method for fabricating an electrical interconnection according to exemplary embodiments of the present inventive concepts.
Figure 6B:
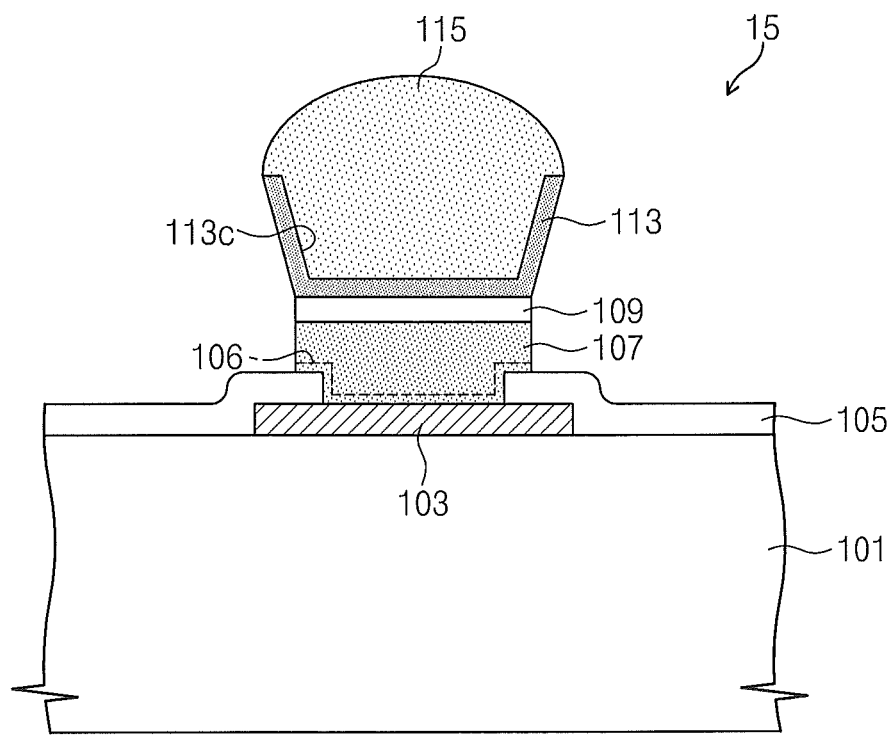

FIGS. 6A and 6B are cross-sectional views illustrating a method for fabricating an electrical interconnection according to exemplary embodiments of the present inventive concepts.

Referring to FIG. 6A, the solder supporter 113 may be formed after the formation of the mask 111 by processes identical or analogous to those explained with reference to the FIGS. 1A to 1C. The mask 111 may have the opening pattern 111p whose width becomes smaller toward the metal cap 109. The shape of the opening pattern 111p may be rhombus or diamond. The solder supporter 113 may have an inner space 113c whose width becomes greater upwardly.

Referring to FIG. 6B, the solder 115a may be provided and then reflowed to form the solder ball 115. Therefore, a fifth electrical interconnection 15 may be formed to have the solder ball 115, which fills up the broad inner space 113c of the solder supporter 113. The fifth electrical interconnection 15 may have a shape of a pillar. The solder supporter 113 may become broader upwardly, such that the solder ball 115 may have an enlarged volume.

<Embodiment 6>

Figure 7A:
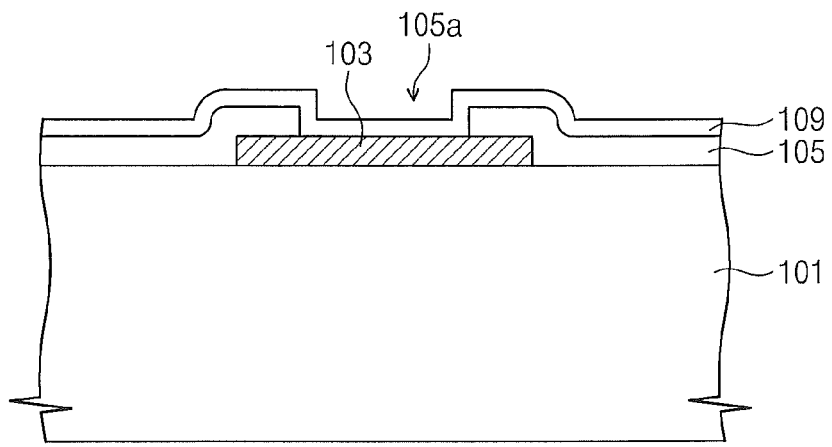
FIGS. 7A to 7C are cross-sectional views illustrating a method for fabricating an electrical interconnection according to exemplary embodiments of the present inventive concepts.
Figure 7B:
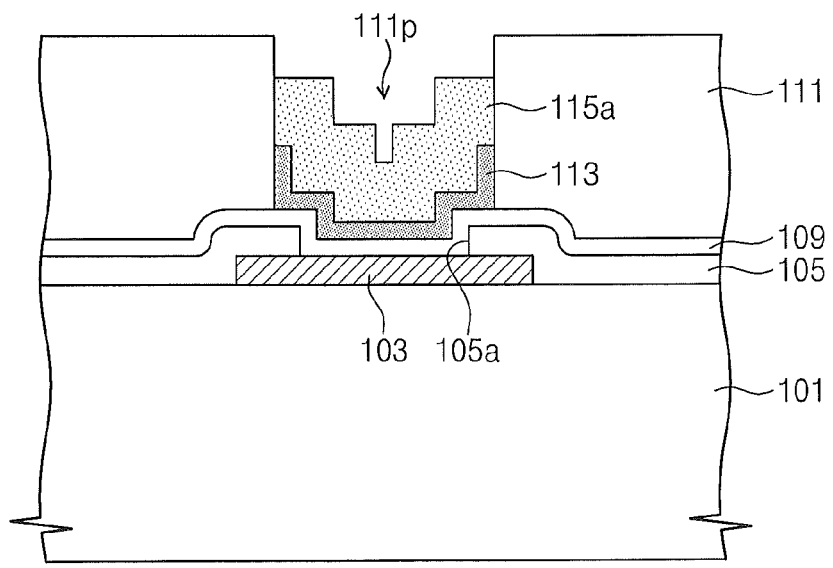
Figure 7C:
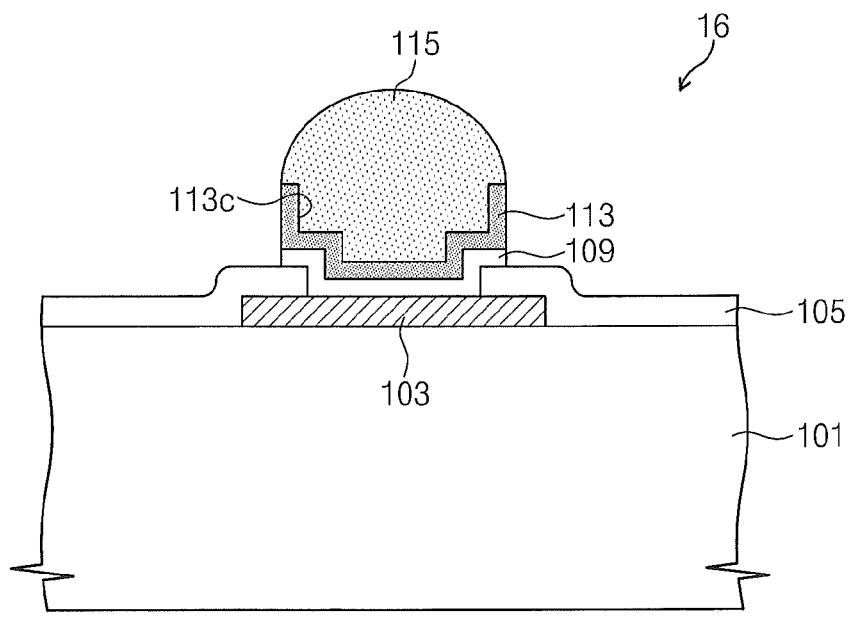

FIGS. 7A to 7C are cross-sectional views illustrating a method for fabricating an electrical interconnection according to exemplary embodiments of the present inventive concepts.

Referring to FIG. 7A, the bonding pad 103 may be formed on the substrate 101, such as a silicon wafer and the passivation layer 105 may be formed on the substrate 101. The passivation layer 105 may have an opening 105a, which exposes the bonding pad 103. The metal cap 109 may be formed on the substrate 101. The metal cap 109 may be electrically connected to the bonding pad 103. The metal cap 109 may comprise a metal having an ionization tendency or reactivity lower than the bonding pad 103. As an example, the metal cap 109 may comprise a noble metal, such as Ru, Rh, Pd, Ag, Re, Os, Ir, Pt, Au or any combinations thereof. According to the present inventive concept, the metal cap 109 may be formed by depositing or electroless plating Au. The metal cap 109 may be formed on the bonding pad 103 and the passivation layer 105.

Referring to FIG. 7B, the mask 111 may be formed to have the opening pattern 111p, which exposes the metal cap 109 and the solder supporter 113 may be formed by an electroplating using the mask 111. The solder 115a may be formed to fill up the opening pattern 111p such that the solder supporter 113 may cover the solder 115a. As one example, the opening pattern 111p of the mask 111 may have a width greater than that of the opening 105a of the passivation layer 105. The solder supporter 113 may overlap with a portion of the passivation layer 105 to have a stair-stepped structure.

Referring to FIG. 7C, the mask 111 may be removed and the solder 115a may be reflowed to form the solder ball 115. When removing the mask 111, a portion of the metal cap 109, which is not overlapped with the solder supporter 113, may be selectively removed by an etching process. Through sequence of the processes described above, a sixth electrical interconnection 16 may be formed to have the solder ball 115, which fills up the inner space 113c of the stair-stepped solder supporter 113.

<Embodiment 7>

Figure 8A:
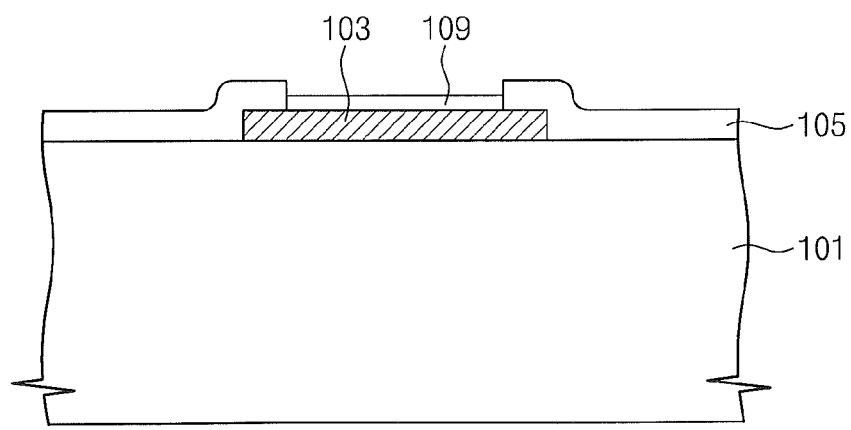
FIGS. 8A to 8C are cross-sectional views illustrating a method for fabricating an electrical interconnection according to exemplary embodiments of the present inventive concepts.
Figure 8B:
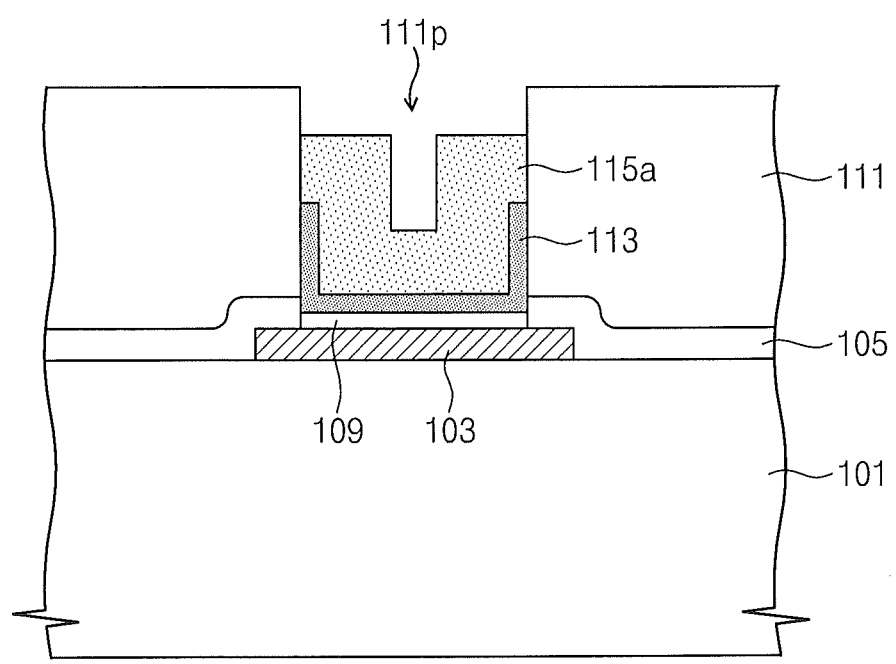
Figure 8C:
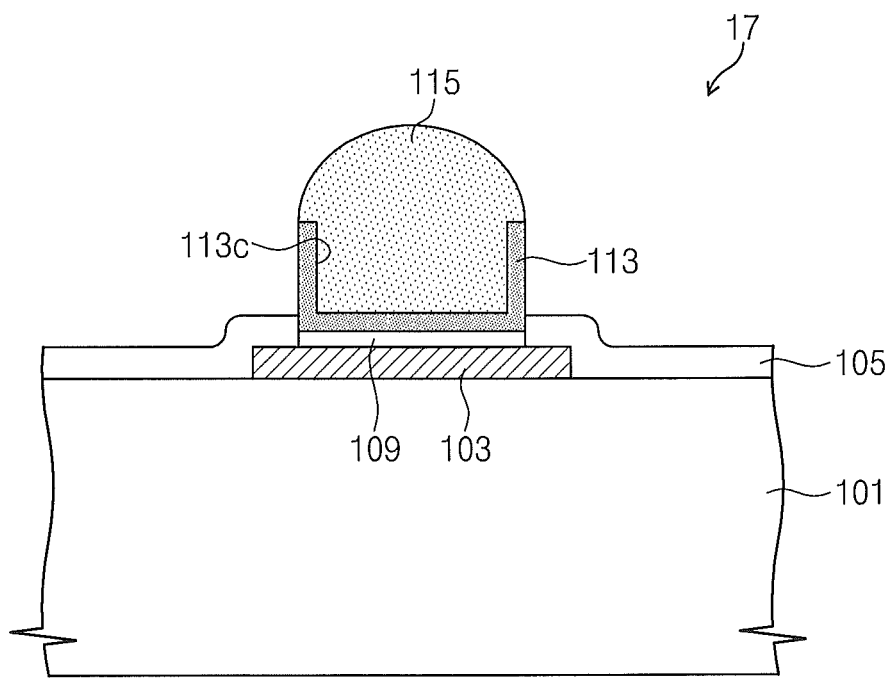

FIGS. 8A to 8C are cross-sectional views illustrating a method for fabricating an electrical interconnection according to exemplary embodiments of the present inventive concepts.

Referring to FIG. 8A, the boding pad 103 may be formed on the substrate 101 and the passivation layer 105 may be formed to expose the bonding pad 103 on the substrate 101. The metal cap 109 may be formed to be electrically connected to the bonding pad 103. The metal cap 109 may be formed by depositing or electroless plating metal and patterning the metal to expose the passivation layer 105. The metal cap 109 may be formed strictly on the bonding pad 103.

Referring to FIG. 8B, the mask 111 may be formed to have the opening pattern 111p which exposes the metal cap 109 and the solder supporter 113 may be formed by an electroplating process using the mask 111. The solder supporter 113 may have various shapes identical or analogous to those depicted FIGS. 2A to 2D. The solder 115a may fill the opening pattern 111p to cover the solder supporter 113.

Referring to FIG. 8C, the mask 111 may be removed and the solder 115a may be reflowed to form the solder ball 115. Therefore, a seventh electrical interconnection 17 may be formed to have the solder ball 115, which fills up the inner space 113c of the bracket-shaped solder supporter 113.

<Embodiments of the Electrical Connection>

FIGS. 9A to 9D are cross-sectional views illustrating electrical connections using the electrical interconnections according to exemplary embodiments of the present inventive concepts.

Figure 9A:
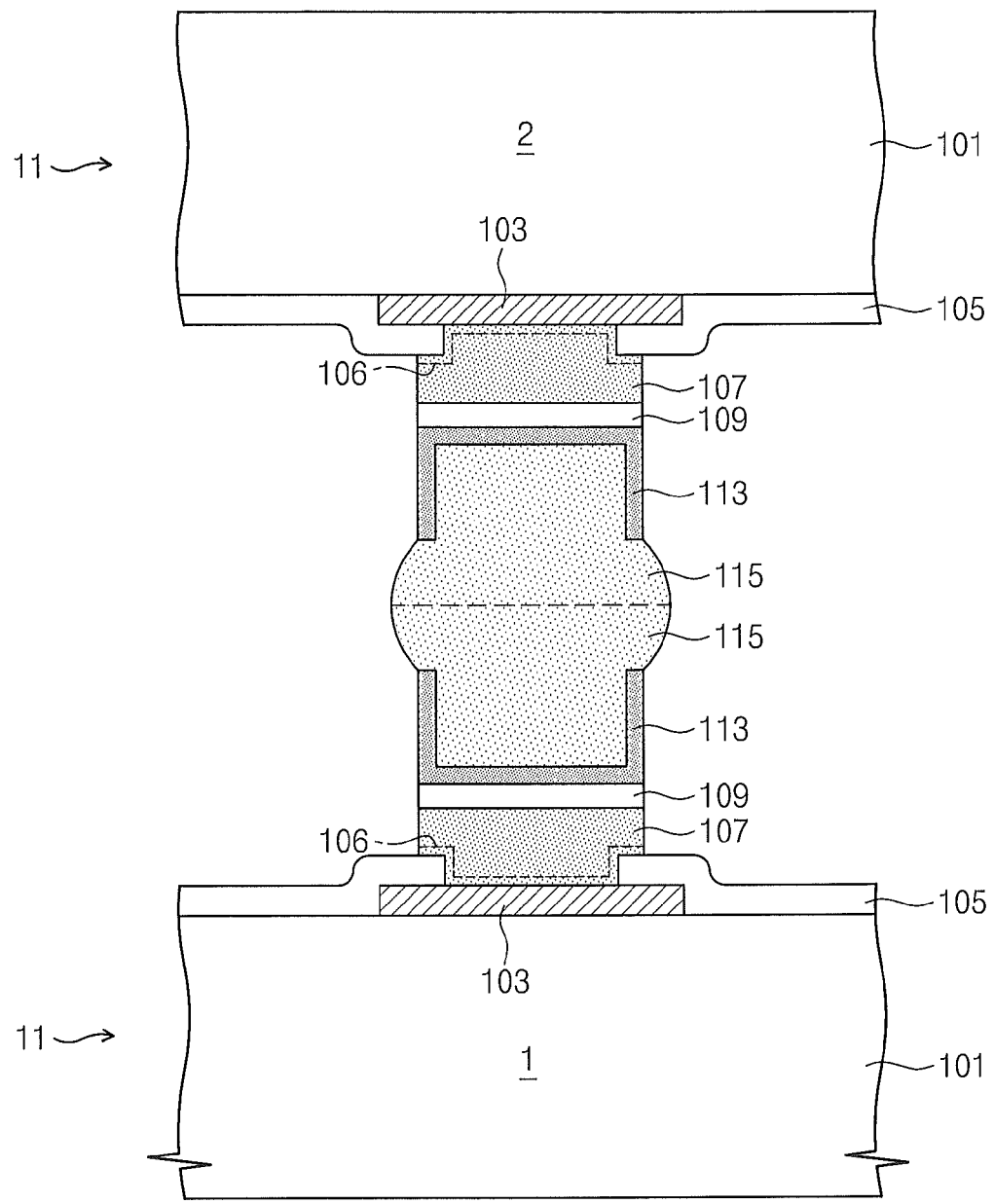
FIGS. 9A to 9D are cross-sectional views illustrating electrical connections using the electrical interconnections according to exemplary embodiments of the present inventive concepts.

Referring to FIG. 9A, semiconductor chips 1 and 2 may be stacked vertically to be electrically connected to each other by the same first electrical interconnections 11 thereof. For example, when respective semiconductor chips 1 and 2 have the first electrical interconnection 11, the first electrical interconnections 11 may be contacted to electrically connect the semiconductor chips 1 and 2 to each other. The first electrical interconnection 11 may be replaced with one of the second to seventh electrical interconnections 12 to 17. For instance, the first semiconductor chip 1 may have the first electrical interconnection 11 and the second semiconductor chip 2 may have one of the second to seventh electrical interconnections 12 to 17.

Figure 9B:
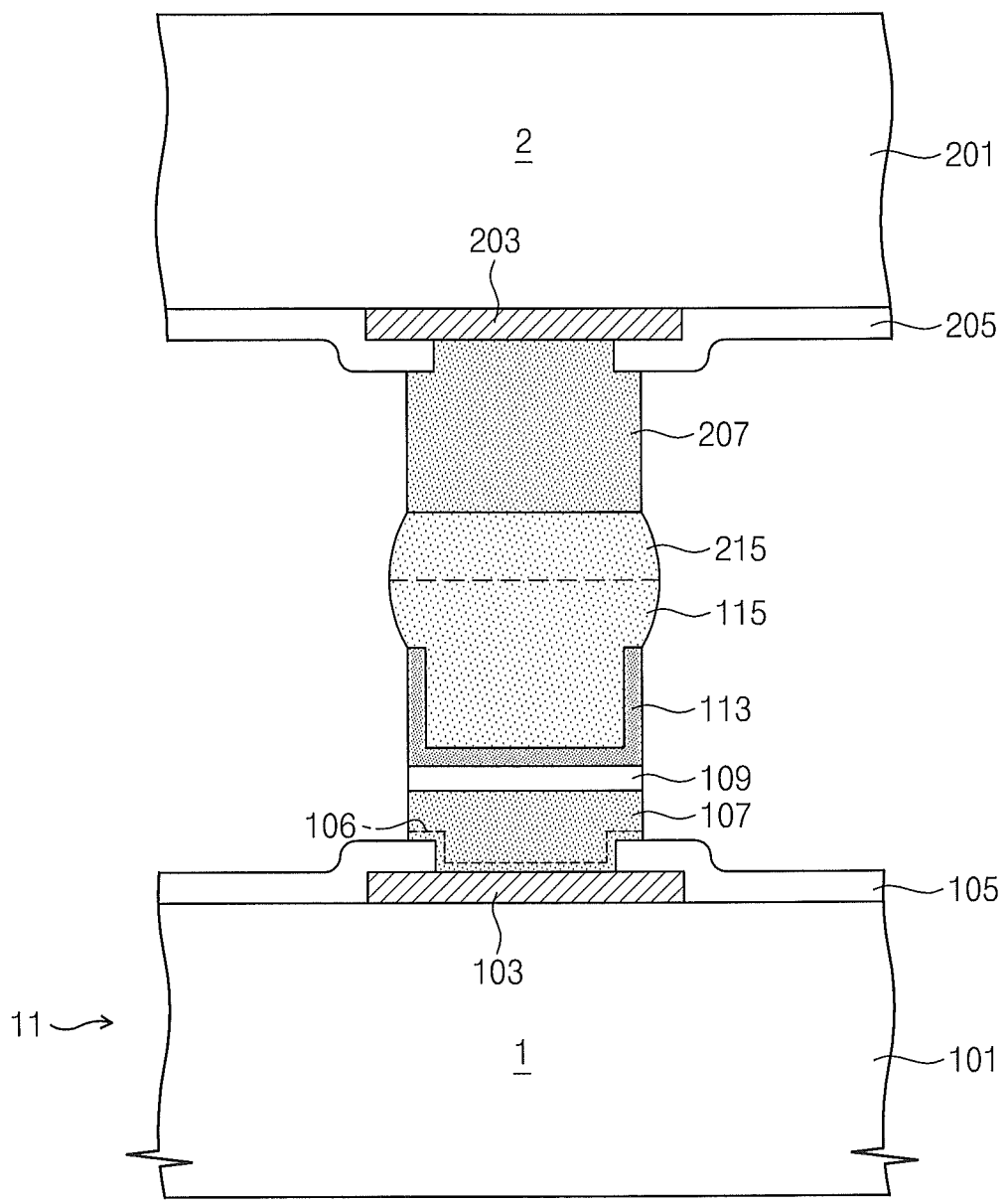

Referring to FIG. 9B, the first semiconductor chip 1 having the first electrical interconnection 11 may be electrically connected to a second semiconductor chip 2 having a second bump pillar 207. The second semiconductor chip 2 may comprise a second substrate 201 having a second bonding pad 203 thereon, a second passivation layer 205 on the second substrate 201, which exposes the second bonding pad 203, and the second bump pillar 207 which is electrically connected to the second bonding pad 203. A second solder ball 215 may be further provided on the second bump pillar 207. According to an exemplary embodiment, the first electrical interconnection 11 may be connected to the second bump pillar 207 such that the first semiconductor chip 1 may be electrically connected to the second semiconductor chip 2. The first electrical interconnection 11 may be replaced with one of the second to seventh electrical interconnections 12 to 17.

Figure 9C:
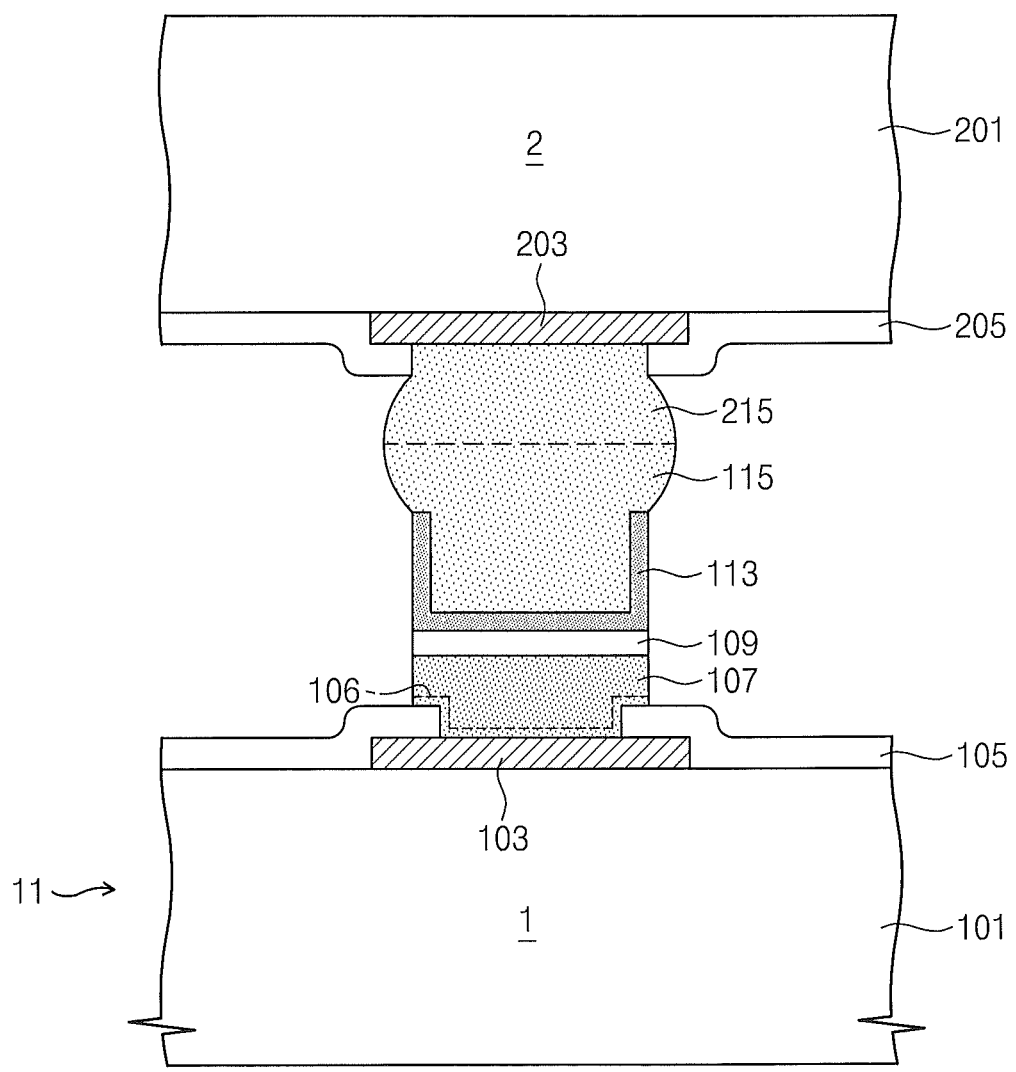

Referring to FIG. 9C, the first semiconductor chip 1 having the first electrical interconnection 11 may be electrically connected to a second semiconductor chip 2 having a second solder ball 215. The second semiconductor chip 2 may comprise a second substrate 201 having a second bonding pad 203 thereon, a second passivation layer 205 on the second substrate 201, which exposes the second bonding pad 203, and the second solder ball 215 which is electrically connected to the second bonding pad 203. According to an exemplary embodiment, the first electrical interconnection 11 may be connected to the second solder ball 215 such that the first semiconductor chip 1 may be electrically connected to the second semiconductor chip 2. The first electrical interconnection 11 may be replaced with one of the second to seventh electrical interconnections 12 to 17.

Figure 9D:
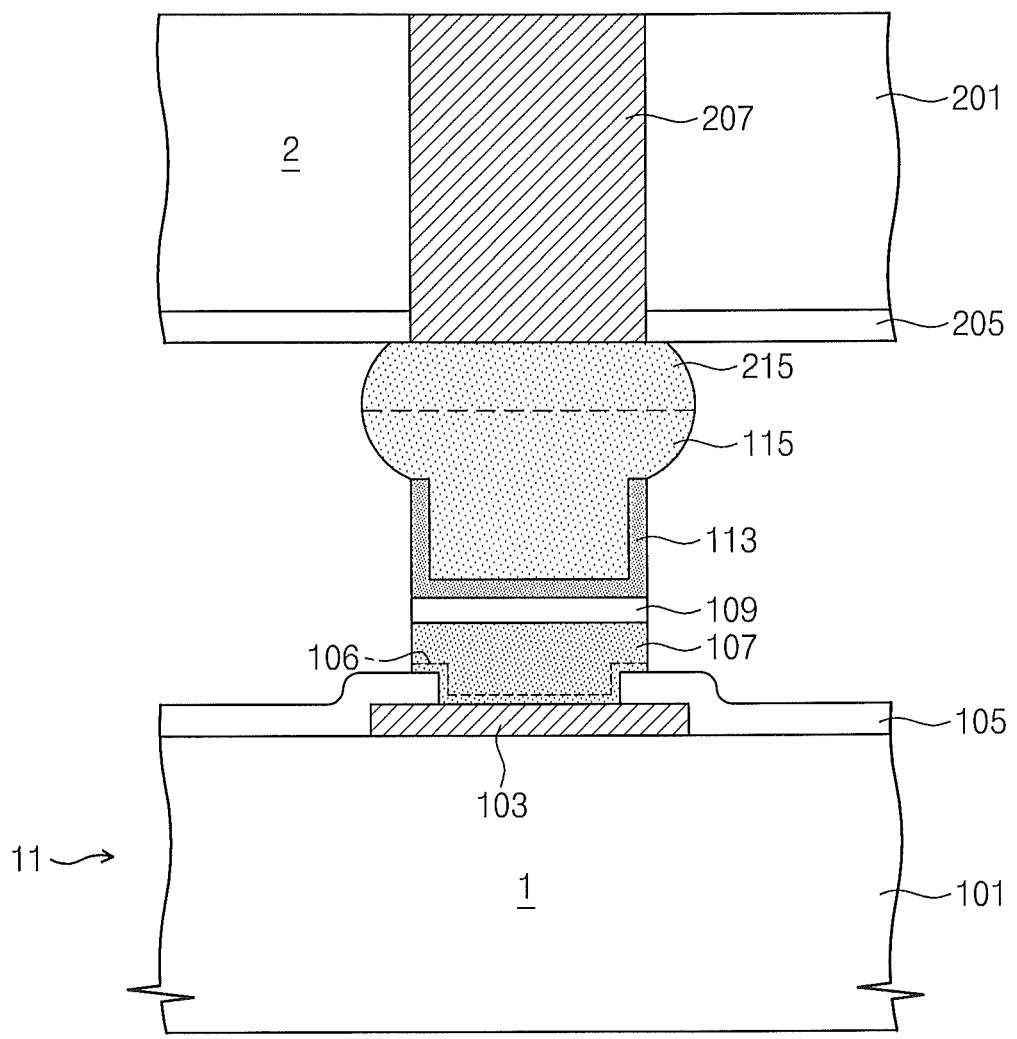

Referring to FIG. 9D, the first semiconductor chip 1 having the first electrical interconnection 11 may be electrically connected to a second semiconductor chip 2 having a through via 207. The second semiconductor chip 2 may comprise the through via 207 which penetrates a second substrate 201 and a second passivation layer 205, which surrounds a protrusion of the through via 207 and covers the second substrate 201. The through via 207 may protrude from a surface of the second substrate 201. According to an exemplary embodiment, the first electrical interconnection 11 may be connected to the through via 207 such that the first semiconductor chip 1 may be electrically connected to the second semiconductor chip 2. The first electrical interconnection 11 may be replaced with one of the second to seventh electrical interconnections 12 to 17.

<Applications>

Figure 10A:
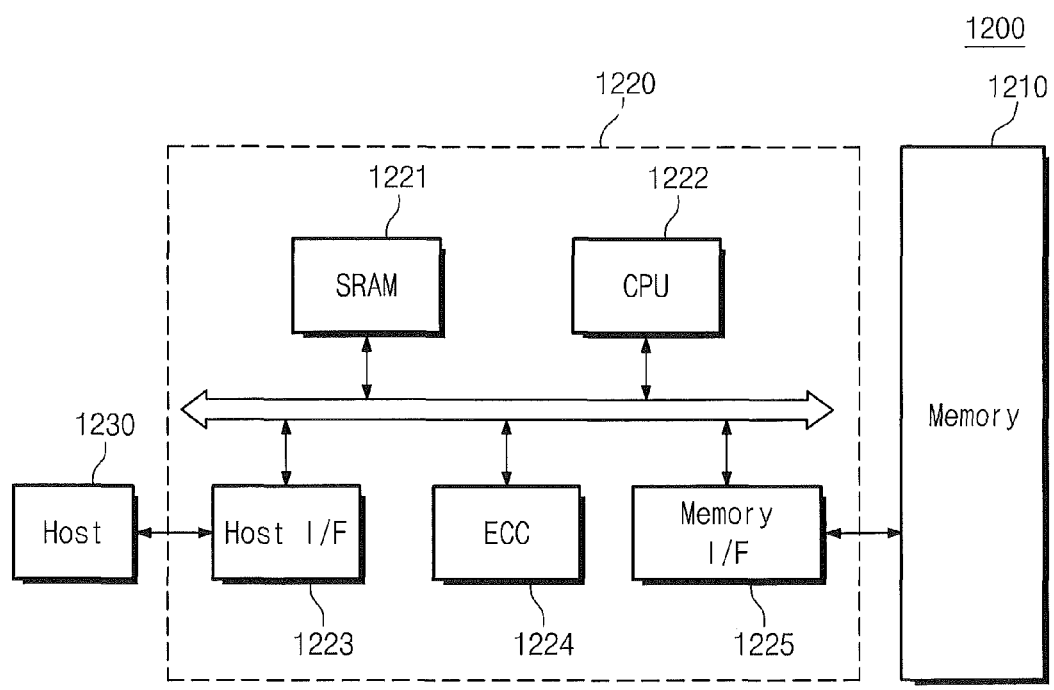
FIG. 10A is a schematic block diagram illustrating an example of memory cards including at least one of the electrical interconnections according to exemplary embodiments of the present inventive concepts.

FIG. 10A is a schematic block diagram illustrating an example of memory cards including at least one of the electrical interconnections according to exemplary embodiments of the present inventive concepts.

Referring to FIG. 10A, a semiconductor memory 1210 including at least one of the electrical interconnections 11 to 17 according to the various example embodiments of the invention is applicable to a memory card 1200. For example, the memory card 1200 may include a memory controller 1220 generally controlling data exchange between a host and the flash memory device 1210. An SRAM 1221 is used as a work memory of a processing unit 1222. A host interface 1223 has a data exchange protocol of a host connected to the memory card 1200. An error correction coding block 1224 detects and corrects errors contained in data read from the multi-bit flash memory device 1210. A memory interface 1225 interfaces the flash memory device 1210 according to the example embodiments. The processing unit 1222 generally controls data exchange of the memory controller 1220.

Figure 10B:
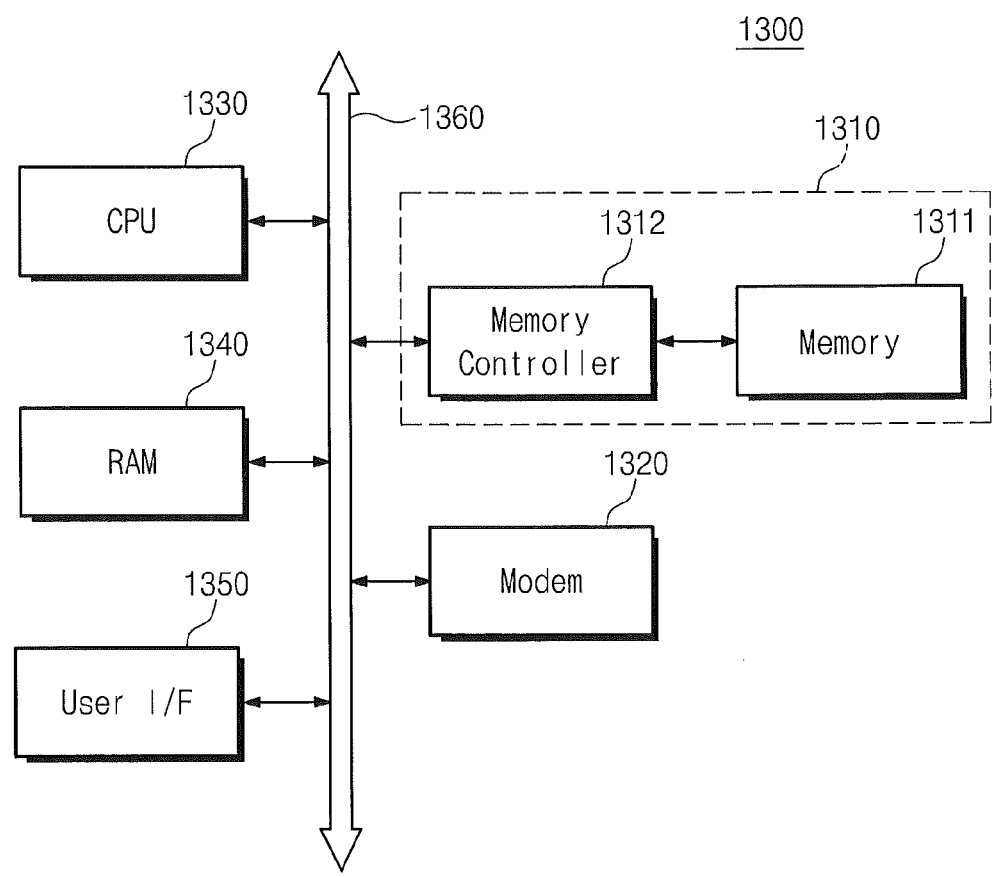
FIG. 10B is a schematic block diagram illustrating an example of an information process system including at least one of electrical interconnections according to exemplary embodiments of the present inventive concepts.

FIG. 10B is a schematic block diagram illustrating an example of an information process system including at least one of the electrical interconnections according to exemplary embodiments of the present inventive concepts.

Referring to FIG. 10B, an information processing system 1300 may include a memory system 1310 having at least one of the electrical interconnections 11 to 17 according to the example embodiments of the invention. The information processing system 1300 includes a mobile device or a computer. For example, the information processing system 1300 may include a modem 1320, a central processing unit 1330, a RAM 1340, and a user interface 1350 electrically connected to the flash memory system 1310 via a system bus 1360. The flash memory 1310 may include a memory 1311 and a memory controller 1312 and have substantially the same configuration as that of the memory card 1200 in FIG. 10A. The flash memory system 1310 stores data processed by the central processing unit 1330 or data input from the outside. The information process system 1300 may be provided as a memory card, a semiconductor device disk, a camera image sensor, and other application chipsets. For example, the memory system 1310 may be realized as a solid state drive (SSD). In this case, the information processing system 1300 may stably store large amounts of data in the flash memory system 1310.

According to exemplary embodiments of the present inventive concepts, the solder supporter is formed to have inner space, which can be filled with solder in a relatively large volume. As a result, the large solder ball can be formed to improve the electrical connection. In addition, even effects of intermetallic compounds and/or cracks that occur at the boundary between the solder supporter and the solder extended boundary can decrease cracks. Therefore, the reliability of the semiconductor device can be improved.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. An electrical interconnection comprising:
a substrate comprising a bonding pad formed thereon;
a solder ball electrically connected to the bonding pad;

a solder supporter on the bonding pad, a portion of the solder ball filling the solder supporter; and a metal layer between the bonding pad and the solder supporter, the metal layer having an ionization tendency lower than the bonding pad;

wherein the metal layer has an upper surface adjacent to the solder supporter and a lower surface adjacent to the bonding pad, the solder supporter covering an entirety of the upper surface of the metal layer.

2. The electrical interconnection of claim 1, further comprising a passivation layer on the substrate through which the bonding pad is exposed.

3. The electrical interconnection of claim 1, wherein the solder supporter comprises:

a floor adjacent to the bonding pad; and a vertical wall upright from an edge of the floor, wherein the floor and the vertical wall define an inner space of the solder supporter, the inner space being filled with the portion of the solder ball, and wherein the other portion of the solder ball protrudes outside of the solder supporter.

4. The electrical interconnection of claim 3, wherein at least one of the floor and the vertical wall has a shape of stairs.

5. The electrical interconnection of claim 3, wherein the solder supporter further comprises an extension extending outwardly from the vertical wall.

6. The electrical interconnection of claim 3, wherein a contacting portion of the solder supporter between the floor and the vertical wall is rounded.

7. The electrical interconnection of claim 1, further comprising a bump pillar between the bonding pad and the metal layer, wherein the metal layer has an ionization tendency lower than the bump pillar.

8. An electrical interconnection, comprising:

a substrate;

a support layer on the substrate;

a metal layer on the support layer;

a solder supporter on the metal layer; and a solder ball disposed in the solder supporter;

wherein the metal layer has an ionization tendency lower than the support layer;

wherein the metal layer has an upper surface adjacent to the solder supporter and a lower surface adjacent to the support layer, the solder supporter covering an entirety of the upper surface of the metal layer.

9. The electrical interconnection of claim 8, wherein the support layer comprises a bonding pad.

10. The electrical interconnection of claim 9, wherein the support layer further comprises a bump pillar on the bonding pad;

wherein the metal layer has an ionization tendency lower than the bump pillar and the bonding pad.

11. The electrical interconnection of claim 8, wherein the solder supporter comprises a vertical wall having a stair step portion thereof.

12. The electrical interconnection of claim 8, wherein the solder supporter comprises a floor and a vertical wall that extends from the floor and defines an opening for receiving the solder ball;

wherein the opening is larger at a top of the vertical wall away from the floor than the opening is at the bottom of the vertical wall adjacent to the floor.

* * * * *